under 35

(12) United States Patent  
Prandi et al.

(10) Patent No.: US 9,461,625 B1  
(45) Date of Patent: Oct. 4, 2016

(54) SWITCHED-CAPACITOR NETWORK WITH INPUT-OUTPUT COMMON MODE DECOUPLING

(71) Applicant: Maxim Integrated Products, Inc., San Jose, CA (US)

(72) Inventors: Luciano Prandi, Bellinzago Novarese (IT); Carlo Caminada, Pregnana Milanese (IT); Carlo Alberto Romani, Cornaredo (IT)

(73) Assignee: Maxim Integrated Products, Inc., San Jose, CA (US)

( * ) Notice: Subject to any disclaimer, the term of this patent is extended or adjusted under 35 U.S.C. 154(b) by 27 days.

(21) Appl. No.: 13/895,807

(22) Filed: May 16, 2013

Related U.S. Application Data

(60) Provisional application No. 61/750,271, filed on Jan. 8, 2013.

(51) Int. Cl.  
*H03B 1/00* (2006.01)  
*H03K 3/012* (2006.01)  
*H03K 3/013* (2006.01)

(52) U.S. Cl.  
CPC .............. *H03K 3/012* (2013.01); *H03K 3/013* (2013.01)

(58) Field of Classification Search  
CPC .... H03H 19/004; G11C 27/026; H03F 3/005  
See application file for complete search history.

(56) References Cited

U.S. PATENT DOCUMENTS

| | | | | |
|---|---|---|---|---|
| 8,009,071 | B2* | 8/2011 | Sundblad | H03F 3/45475 327/337 |
| 8,429,981 | B2* | 4/2013 | Grosjean | G01P 15/125 73/771 |
| 2011/0279148 | A1* | 11/2011 | Watanabe | G11C 27/026 327/96 |

* cited by examiner

*Primary Examiner* — Sibin Chen  
(74) *Attorney, Agent, or Firm* — North Weber & Baugh LLP (57) ABSTRACT

Various embodiments of the invention provide for cancellation of unwanted signals in switched-capacitor circuits. In certain embodiments cancellation this is accomplished by performing a multi-phase CDS technique. The technique comprises resetting capacitive elements in the feedback path of an operational amplifier during a reset interval, maintaining a decoupled condition during a sampling interval in which the unwanted signals are sampled, and cancelling unwanted signals in a sensing interval.

19 Claims, 6 Drawing Sheets

SWITCHED-CAPACITOR NETWORK WITH INPUT-OUTPUT COMMON MODE DECOUPLING

CROSS REFERENCE TO RELATED PATENT APPLICATIONS

The present application claims priority to U.S. Provisional Application Ser. No. 61/750,271 titled "Switched-Capacitor Network with Input-Output Common Mode Decoupling," filed on Jan. 8, 2013 by Luciano Prandi, Carlo Caminada, and Carlo Alberto Romani, which application is incorporated herein by reference in its entirety.

BACKGROUND

1. Technical Field

The present invention relates to analog sensor circuits, and more particularly, to systems, devices, and methods of removing disturbance signals from analog differential sensor front end circuits using switched-capacitor topologies.

2. Background of the Invention

Differential switched-capacitor topologies are widely used in analog circuits. Correlate double sampling (CDS) techniques are oftentimes used in switched-capacitor circuits to reduce non-idealities of circuit components, such as amplifier offset and flicker noise, which can otherwise couple into the operational amplifier and cause large error signals. Typically, the CDS technique acts in two different phases: in the first phase the circuit measures an unwanted signal and stores it in a proper way; in the second phase the circuit removes the unwanted signal by way of subtraction in the path of the signal allowing the signal to pass through the circuit without the effect of the unwanted signal like, offset, and flicker noise (1/f).

Reducing unwanted quantities is of particular concern in applications using electronic sensors circuits that contain front end low-noise amplifiers. A major challenge exists in receiving read signals generated by a sensor while allowing as few circuit non-idealities as possible to enter the reading circuit. Sensors circuits that are part of portable, battery-operated systems place additional severe requirements regarding very low power consumption on front end circuits.

The two main sources of unwanted signals are offset and 1/f noise. It is possible to reduce both components by designing relatively large circuits; however, structures that occupy a large silicon area are disfavored mainly due to increased cost associated with such approaches. Particularly in the field of sensors, offsets can sometimes be relative large when compared to the sensor readout signal. A large offset signal has a strong impact on dynamic range and significantly limits the performance of the sensor read chain and, ultimately, the performance of the overall sensor reading system.

In order to increase efficiency of sensor systems, it would be desirable to have systems and methods that allow to read and store information associated with unwanted signal components and to remove such signals while reducing current consumption and optimizing dynamic range, thereby, improving overall circuit performance.

SUMMARY OF THE INVENTION

Various embodiments of the invention provide for switched-capacitor circuits that read and efficiently reduce the effects of unwanted signals, such as amplifier offset, 1/f noise, and kT/C noise. In particular, certain embodiments of the invention perform CDS techniques using a single stage amplification chain that allows to receive two separate input and output common mode voltages. The availability of separate input and output common modes allows to choose an optimized operational amplifier structure to achieve optimal performance in terms of noise and current consumption.

In various embodiments a switched-capacitor circuit comprises a fully differential operational amplifier that comprises capacitive elements in a feedback path that are reset during a reset interval and are maintained in a decoupled condition during a sampling interval during which the unwanted signals are sampled. In a sensing interval, the switched-capacitor circuit operates to amplify sensor signals while cancelling the unwanted signals without compromising the output dynamic range of the operational amplifier.

Some embodiments provide for optimal current consumption in a switched-capacitor circuit for a given noise performance by using a single stage amplification chain that significantly reduces silicon area typically occupied by dual stage amplification chain approaches of the prior art and further minimizes noise by minimizing the number of noise-generating components. Certain embodiments of the invention take advantage of a multiplexer when using the capacitive elements in the feedback path to perform a CDS technique. In order to read out a multi-axis sensor, the multiplexer is located before an operational amplifier that comprises a plurality of switches.

Certain features and advantages of the present invention have been generally described here; however, additional features, advantages, and embodiments are presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention. In this document the term "phase" and "interval" are used interchangeably.

Figure 1:
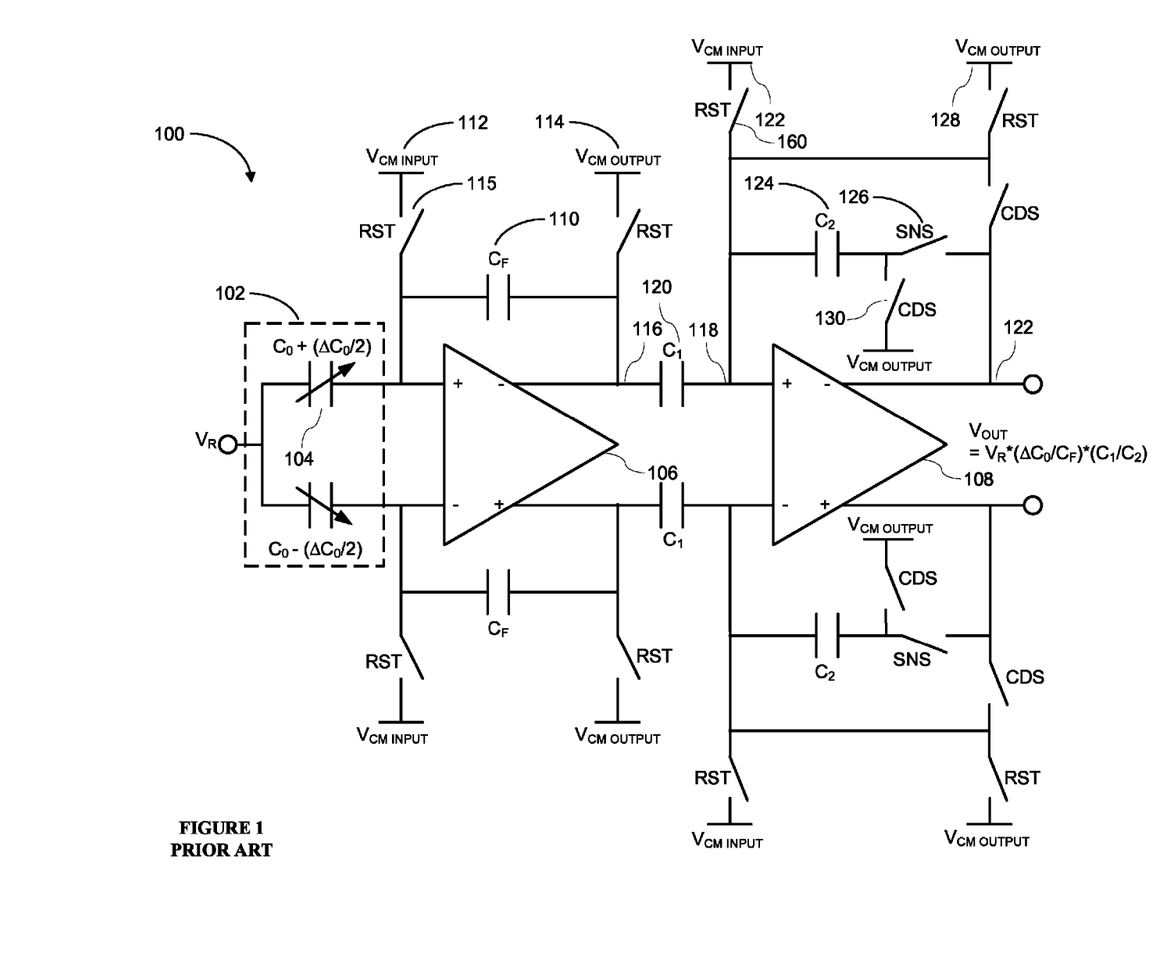
FIG. 1 shows a prior art analog front end circuit utilizing noise and offset cancellation in a dual amplifier stage circuit.

FIG. 1 shows a prior art analog front end circuit utilizing noise and offset cancellation in a dual amplifier stage topology. Circuit 100 reads out a differential sensor signal from capacitive sensor 102 that comprises two variable capacitors 104. Variable capacitors 104 are connected to a differential input of first stage amplifier 106. The input and output of first stage amplifier 106 are connected via feedback capacitor 110. Feedback capacitor 110 is further connected to input common mode voltage 112 and an output common mode voltage 114 via a pair of reset switches 115 to separate input common mode voltage 112 and output common mode voltage 114 of first stage amplifier 106.

Differential outputs 116 of first stage amplifier 106 are connected to differential inputs 118 of second stage amplifier 108 through capacitor $C_1$ 120. Second feedback capacitor 124 couples the differential inputs 118 and outputs 122 of the of second stage amplifier 108 via sense switch 126. Feedback capacitor 124 is further connected between input common mode voltage 122 and output common mode voltage 128 of second stage amplifier 108.

In order to demonstrate the functionality of the read chain it is assumed that, in the absence of signals, capacitive sensor 102 has a capacitance value equal to $C_0$. Once an external force (e.g., an acceleration, an angular rate, or any other physical quantity) is transduced by sensor 102, capacitors 104 are differentially capacitively unbalanced by a capacitance value equal to $\Delta C_0$. The magnitude of the capacitive unbalancing is proportional to the external force and generates the input signal of the read chain that is input to first stage amplifier 106. First stage amplifier 106 amplifies the input signal in order to produce an output signal that can be expressed by $$V_{OUT\_1} = V_R * \Delta C_0 / C_F$$

During a reset phase, capacitor $C_F$ 110 is charged to a capacitance value equal to $V_{CM\ OUTPUT} - V_{CM\ INPUT}$. This allows $V_{CM\ INPUT}$ 112 to be different from $V_{CM\ OUTPUT}$ 114.

At the same time, the offset and the low frequency noise 1/f are amplified according to the equation $$V_{OUT\_1\_OS} = V_{OS} * C_0 / C_F$$

Since the operational amplifier offset is amplified by the first stage, this significantly limits the dynamic range of the first stage itself and determines the signal-to-noise ratio.

Second stage amplifier 108 operates as follows. During a sense phase, switch 160, 130 is open, and switch 126 closed. In this phase, second stage amplifier 108 amplifies the useful signal from first stage amplifier 106 according to the equation:

$$V_{OUT\_2} = V_{OUT\_1} * C_1 / C_2$$

Capacitor 120 is used to perform a passive CDS on the first stage. During the reset phase, $V_{CM\ INPUT}$ 190 is shorted to $V_{CM\ OUTPUT}$ 128, such that the second stage of the chain cannot sustain different common mode voltages between input 118 and output 122. When performing active CDS, capacitor $C_1$ 120 and feedback capacitor $C_2$ 124 store the offset of second stage operational amplifier 108 during the CDS phase, at which time RST switch 160 is open and 130 remains closed. During the reset phase the second stage functions as a buffer and does not amplify the offset signal of first stage amplifier 106. As a result, circuit 100 requires two separate amplifiers in order to sustain different common mode voltages between sensor 102 and amplifier output 122 when canceling the main non-idealities previously discussed. The complexity involved in using two separate stages with two separate operational amplifiers 106, 108 and feedback networks containing numerous switches has a strong negative impact on area and power consumption as well as noise. Additionally, it is inherently more difficult to manage the generation of the various phases (shown in FIG. 2), due to numerous second order effects that must be taken into account and adjusted for when synchronizing the two amplifier stages in the layout of circuit 100.

Switched capacitor circuits require non-overlapping phases to properly operate, mainly to avoid undesired sharing of charge between capacitors. In addition, non-overlapping phases are important to avoid spurious charge injection from the switches that can be amplified in the different amplification stages.

Another limitation of prior art circuit 100 lies in the difficulty of designing the bandwidths of operational amplifiers 106, 108. Since first stage amplifier 106 requires a finite bandwidth that is sufficiently small to keep noise at a minimum level and sufficiently large to provide a proper readout signal, once a voltage step signal $V_R$ is applied to sensor 102, the outputs of amplifier 106 and 108 will exponentially follow in a manner consistent with an RC transient. Therefore, input signal 118 of second stage amplifier 108 will not be a voltage step, and since second stage amplifier 108 has limited bandwidth, output signal 122 will be a function of both first stage amplifier 106 and second stage amplifier 108 response. This forces analog circuit designers to make a compromise between the bandwidths of the first and the second stage.

Figure 2:
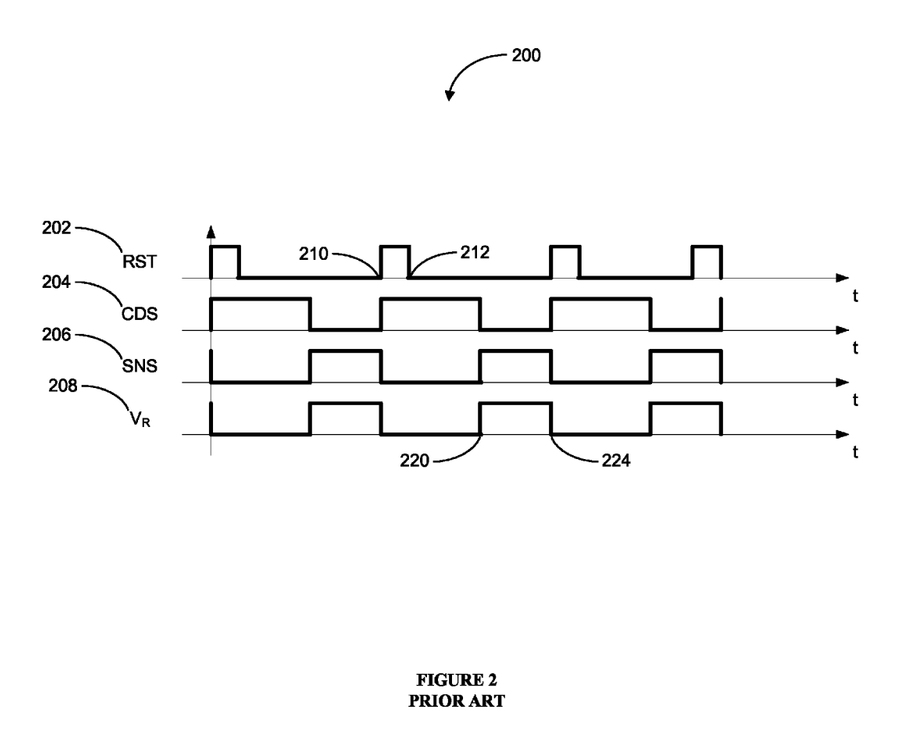
FIG. 2 is an exemplary timing diagram illustrating phases of signal waveforms used in the analog front end circuit of FIG. 1 and FIG. 3.

FIG. 2 is an exemplary timing diagram illustrating phases of signal waveforms used in the analog front end circuit of FIG. 1 and FIG. 3. Timing diagram 200 shows non-overlapping two-phase signals 202-206 designated as RST, CDS, and SNS. Each phase signal 202-206 may be generated by a phase generator to control one or more switching elements. With reference to FIG. 1, phase signal RST controls RST switch 160, phase signal CDS controls CDS switch 130, and phase signal SNS controls SNS switch 160, respectively. Reading signal $V_R$ 208 is a stimulus that is applied to the input of sensor 102.

In FIG. 2 a high logic phase signal following a rising edge corresponds to a closed switch position, while a logic low phase signal following a falling edge corresponds to an open switch position. For the purposes of this application, each phase signal may be inverted from a logic high to a logic low and vice versa to accomplish switching functions as described below. A cycle between two successive rising edges of the reset phase represents the period of the read chain.

Figure 3:
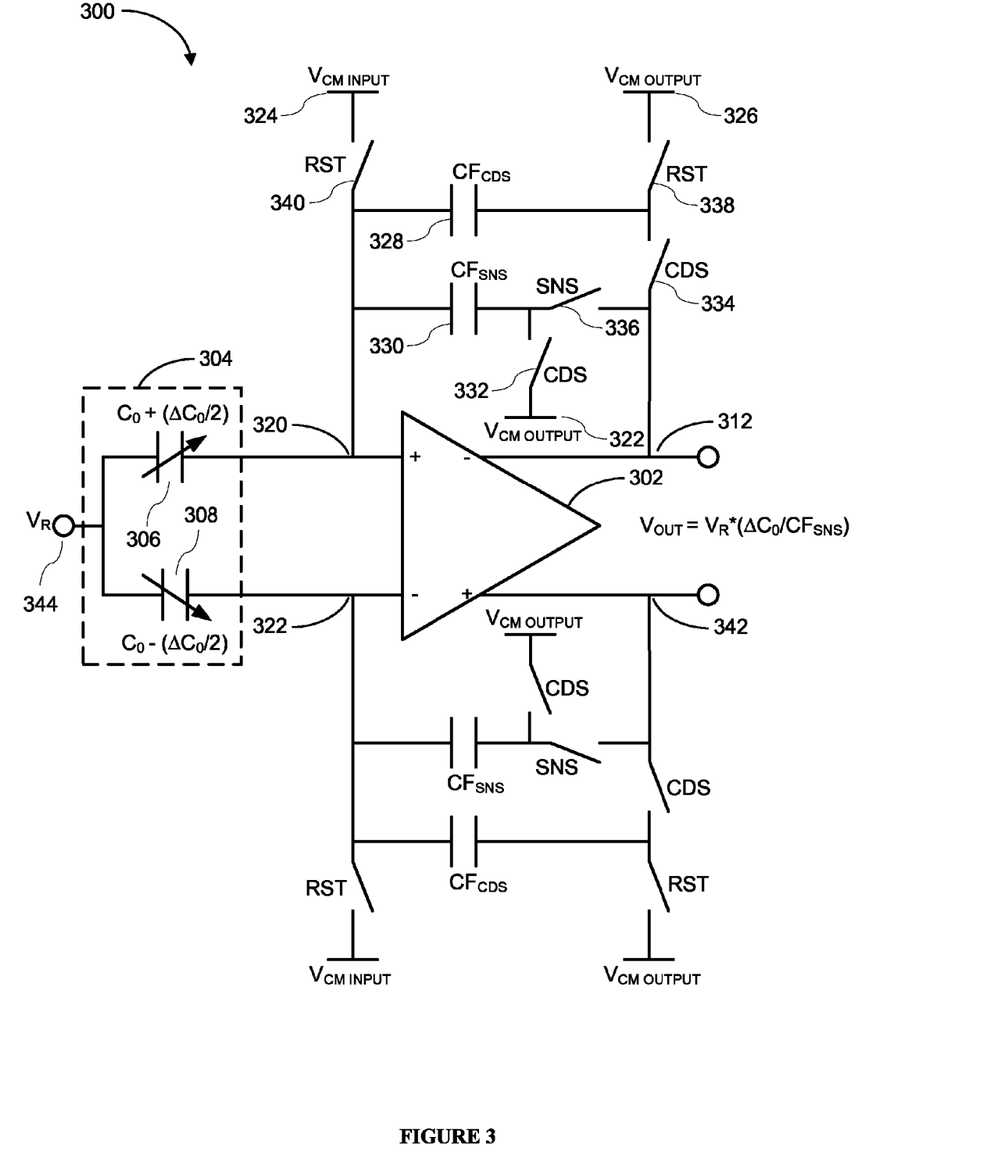
FIG. 3 illustrates an analog sensor front end circuit implementation of a switched capacitor network, according to various embodiments of the invention.

FIG. 3 illustrates an analog sensor front end circuit implementation of a switched capacitor network, according to various embodiments of the invention. Operational amplifier 302 constitutes the main circuit block of front end circuit 300. In one embodiment, amplifier 302 is implemented as a fully differential single stage charge amplifier that employs a switch capacitor circuit comprising feedback capacitor 328, 330, reset switch 338, 340, correlated double sampling (CDS) switch 332, 334, and sensing switch 336. Common mode voltage input terminal 324 is coupled to an input common mode voltage denoted as $V_{CM\_INPUT}$. Common mode voltage output terminal 326, 332 is coupled to an output common mode voltage denoted as $V_{CM\_OUTPUT}$. Amplifier 302 has a feedback path that comprises feedback capacitors 330, 328 coupled between each respective input and output node. Input node 320 a non-inverting input terminal of operational amplifier 302 is configured to receive signals from variable capacitor 306 of sensor 304, while input node 322 at the inverting input of amplifier 302 is configured to couple to receive signals from variable capacitor 308 of sensor 304, respectively.

Sensor 304 may be any sensor known in the art, such as a resistive sensor for use in magnetometers, a resistive pressure sensor, or a capacitive sensor for use in gyroscopes, accelerometers, or pressure sensors. In this example, sensor 304 is a differential sensor that delivers a signal equal to the difference between a positive sensor signal and a negative sensor signal to amplifier 302. Capacitor 306, 308 of sensor 304 comprises a common plate, for example a rotor terminal of a capacitive sensor, to which a square wave or step voltage $V_R$ 344 is applied. The other terminal of capacitor 304, 306 may be connected to a stator of sensor 304. In an RST phase, nodes 320 and 322 are reset to a voltage $V_{CM\_INPUT}$ via switch 340. Similarly, nodes 312 and 342 are reset to a voltage $V_{CM\_OUTPUT}$ via reset switch 338 and CDS switch 334, thereby, charging feedback capacitors 328 and 330 to a value equal to $$(V_{CM\ OUTPUT} - V_{CM\ INPUT}) * CF_{CDS} \text{ and } (V_{CM\ OUTPUT} - V_{CM\ INPUT}) * CF_{SNS},$$

respectively.

During a CDS phase, switches 338 and 340 remain open, such that amplifier offset, low frequency noise, and kT/C noise can be stored on capacitors 306-308, 328, and 330 using an active CDS technique that enables different common mode voltages at the input and output of amplifier 302. The offset at the output of amplifier 302 is equal to $$V_{OUT\_OS} = V_{OS\_IN} * (C_0 + CF_{SNS}) / CF_{CDS}.$$

During an SNS phase CDS switches 332 and 334 are opened while SNS switch 336 remains closed, such that the non-idealities are subtracted without compromising the output dynamic range of amplifier 302. At this time, the output voltage at node 312 assumes a value equal to $$V_{OUT} = V_R * \Delta C_0 / CF_{SNS}$$

and that is free of any amplified offset. Capacitor $CF_{CDS}$ 328, which in the previous CDS phase allowed for different common mode voltages to exist between the input and the output of amplifier 302, floats in the SNS phase at some undefined potential. This removes the kT/C noise without increasing the input capacitance of operational amplifier 302 and, thereby, improves the noise transfer function.

One skilled in the art will appreciate that capacitors 328, 330 can be implemented as banks of parallel variable capacitors that are adjustable to predetermined capacitance values, for example, by using appropriate control logic. Note that because the fully differential topology of front end circuit 300 is symmetrical over charge amplifier 302 in this embodiment, as shown in FIG. 3, input node 322 and output node 342 are symmetrically coupled to the mirror layout of feedback capacitors and switches as described in the previous paragraph. For purposes of clarity and brevity, a detailed description of the symmetrically corresponding components of this exemplary differential circuit is therefore omitted.

In one embodiment, front end switched-capacitor circuit 300 operates on reading signal $V_R$ 344, which may be a voltage having a positive pulse waveform, that is applied to the input of sensor 304 and three phase signals referred to as RST, CDS, and SNS (shown in FIG. 2). The control logic signals that define the phase relationships and control the timing of switches 332-338 are provided by a phase generator (not shown).

It is very useful to have different input and output common mode voltages because they are subjected to very different constraints. The input common mode is chosen to have a well biased differential amplifier. Operational amplifier 302 may be a differential amplifier, such as a telescopic or a folded cascoded amplifier. The input value at the terminals of operational amplifier 302 ideally is constant and does not vary during a read transient. In practice, additional circuitry (not shown) should be added to input node 322 and output node 342. The common mode output voltage is chosen to allow the maximum output dynamic range. One practical value is Vdd/2, wherein Vdd is the voltage at which the amplifier is powered. The additional circuitry added to output node 342 aids to control the output common mode voltage. Different values can be chosen depending on the stages (not shown) that follow the front end stage, such as filters and ADCs. One of the lowest noise stages comprise a telescopic amplifier that typically requires different input and output common mode voltages. This flexibility is very important in devices that operate on a relatively low voltage, for example, below Vdd=1.7 V.

It is understood that the embodiments presented are not limited to front end circuit implementations or to differential circuit implementations. The CDS techniques presented may be beneficially employed in many other switched-capacitor circuits.

Figure 4:
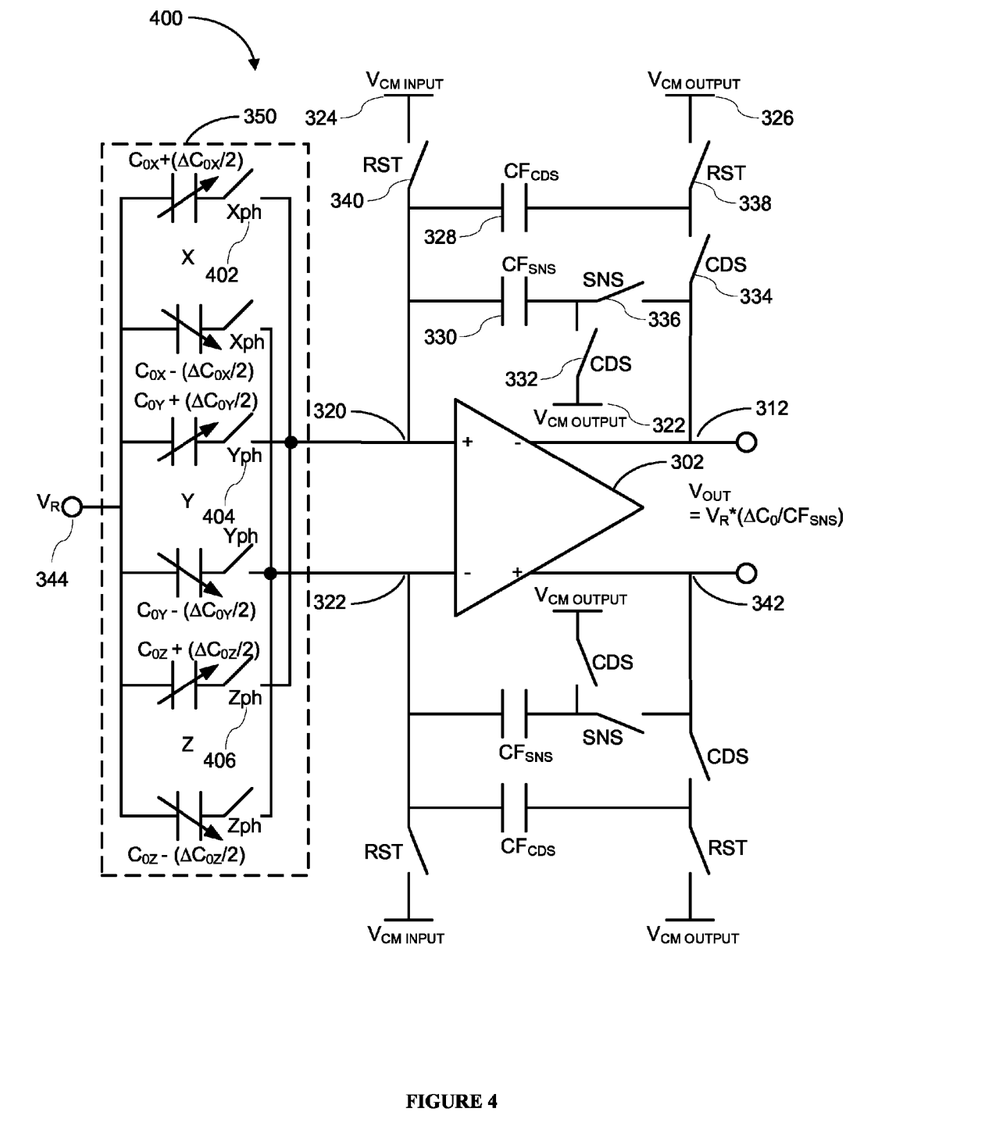
FIG. 4 is an exemplary implementation of a front end circuit for a tri-axial analog sensor utilizing a switched capacitor network, according to various embodiments of the invention.

FIG. 4 is an exemplary implementation of a front end circuit for a tri-axial analog sensor utilizing a switched capacitor network, according to various embodiments of the invention. Sensor 350 is, for example, a multi-axis sensor for use in a capacitive gyroscope, an accelerometer, or a resistive magnetometer. Three different sensors may be read with three different amplifiers. In one embodiment, a multiplexer is inserted before operational amplifier 302 to read sensor 350, such as a tri-axial sensor comprising three sets of variable capacitors on each axis, as shown in FIG. 4. Each sensor within sensor 350 may be controlled by timed control signals that activate and deactivate multiple capacitors via one or more switches 402-406.

In one embodiment, an analog multiplexer comprising six switches 402-406 is coupled to single amplifier 302. Front end circuit 300 may include an input common mode feedback control loop (not shown) to control the input common mode of amplifier 302 in order to avoid any undesirable biasing of the input differential pair. Similarly, an output common mode feedback (not shown) may be employed to control the output common mode at the output of amplifier 302.

Figure 5:
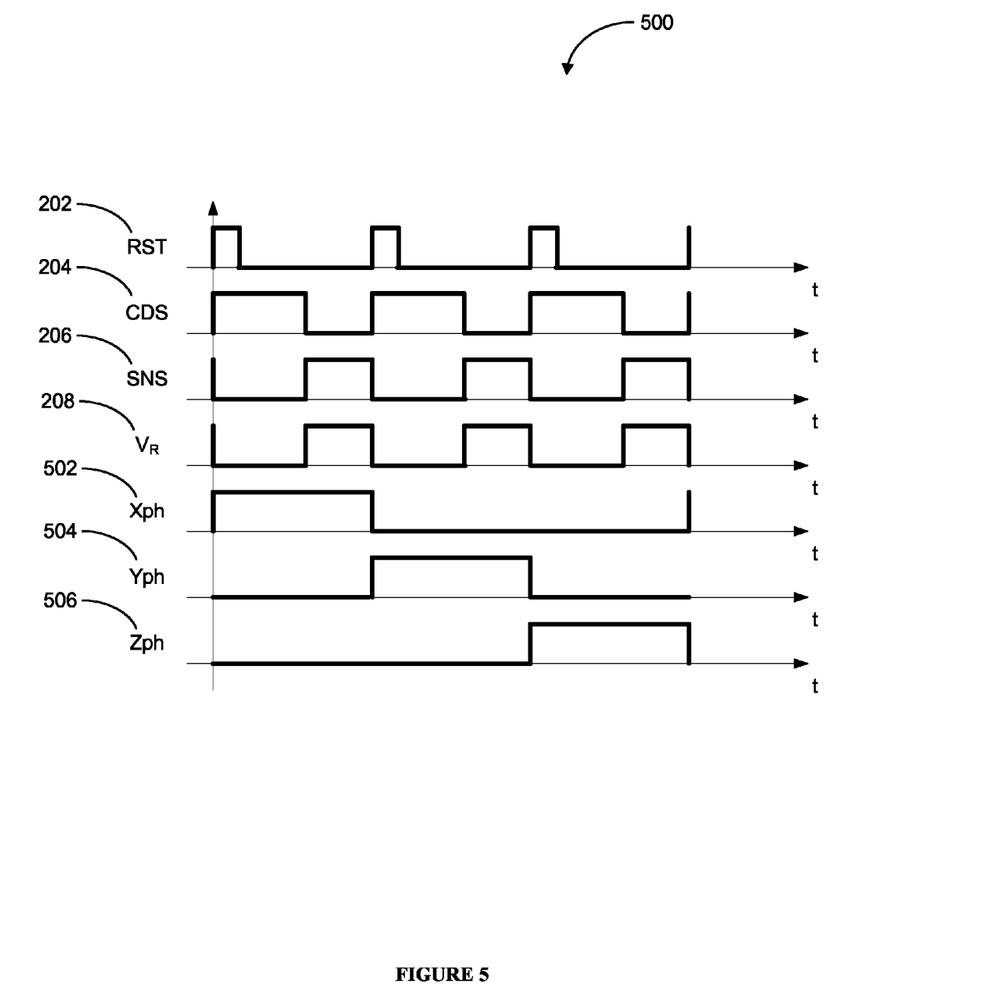
FIG. 5 is a timing diagram illustrating phases of signal waveforms used in the switch capacitor circuit of FIG. 4.

FIG. 5 is a timing diagram illustrating phases of signal waveforms used in the switch-capacitor circuit of FIG. 4. Timing diagram 500 shows non-overlapping phase signals 202-206 RST, CDS, SNS, reading signal $V_R$ 208, and sensor signals Xph, Yph, and Zph 502-506 with respect to each other. With reference to FIG. 4, phase signal RST controls RST switch 340, phase signal CDS controls CDS switch 332, 334, and phase signal SNS controls SNS switch 336, accordingly, while sensor signals 502-506 are controlled by switches 402-406. As shown in FIG. 5, timing signals 202-208 are triggered on varying phases of a cycle, while sensor signals 502-506 are typically out-of-phase from each other in subsequent cycles. A more detailed description of the timing diagram is omitted for purposes of brevity. One skilled in the art will appreciate that sensor signals 502-506 may be delivered to sensors X, Y, and Z via three different channels and read sequentially in time-division.

Figure 6:
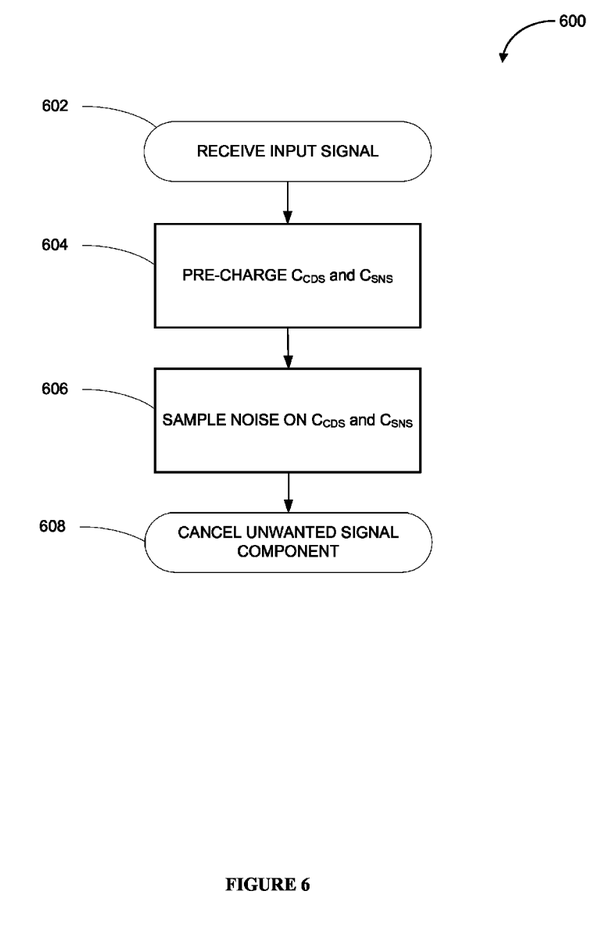
FIG. 6 is a flowchart of an illustrative process for unwanted signal cancellation in accordance with various embodiments of the invention.

FIG. 6 is a flowchart of an illustrative process for unwanted signal cancellation in accordance with various embodiments of the invention. The process for cancelling a noise signal component in a signal starts at step 602 when a CDS feedback capacitor and a sense feedback capacitor are pre-charged to a pre-determined state, for example, during a reset phase by applying an input common mode signal to one terminal and an output common mode signal another terminal of each capacitor.

At step 604, a noise signal component is sampled, for example, on the CDS and sense feedback capacitors during a CDS phase by decoupling both feedback capacitors from the input and output common mode signal via a pair of reset switches.

At step 606, an input signal comprising the unwanted noise signal component is received. The noise signal component may comprise, for example, an operational amplifier offset or flicker noise.

Finally, at step 608, the noise signal component on the sense feedback capacitor is canceled by way of subtraction. This may be accomplished, for example, during a sense phase by coupling the sense feedback capacitor between an input and an output of an operational amplifier via a switch. Simultaneously, the wanted signal component may be amplified and outputted.

One skilled in the art will appreciate that other capacitor configurations are possible to achieve the same result. For example, additional arrays of capacitors may be utilized and provisions can be made to adjust the capacitance values. It will be appreciated by those skilled in the art that fewer or additional steps may be incorporated with the steps illustrated herein without departing from the scope of the invention. No particular order is implied by the arrangement of blocks within the flowchart or the description herein.

It will be appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. A switched-capacitor network to cancel unwanted signals, the switched-capacitor network comprising:

first and second reset switches coupled to a respective input common mode voltage and an output common mode voltage;

an operational amplifier having an input terminal and an output terminal that in a reset phase are selectively connected to receive the input common mode voltage and the output common mode voltage, respectively;

a CDS capacitor coupled between first and second reset switches to decouple the input common mode voltage from the output common mode voltage in a CDS phase;

a sensing capacitor coupled in series with a sensing switch across the operational amplifier in a feedback loop, the sensing capacitor configured to store in a sensing phase a charge associated with an unwanted signal;

a first CDS switch coupled to the sensing capacitor; and a second CDS switch coupled between the output common mode voltage and the output terminal.

2. The network according to claim 1, wherein the first and second reset switches are activated in response to a first clock signal; the first and second CDS switches are activated in response to a second clock signal; and the sense switch is activated in response to a third clock signal.

3. The network according to claim 1, wherein both the operational amplifier and the switched-capacitance network are differential.

4. The network according to claim 1, wherein the operational amplifier is configured to receive an analog differential input signal at the input terminal and provide an amplified output signal corresponding to the analog input signal at the output terminal.

5. The network according to claim 4, wherein the analog differential input signal is generated by a capacitive sensor.

6. The network according to claim 1, wherein the first and second CDS switches are closed in an offset sampling interval and open in a sensing interval within an operation cycle.

7. The network according to claim 1, wherein the reset switch is closed in a reset step and open in the CDS and sensing interval within an operation cycle.

8. A method to cancel unwanted signals in switched-capacitor networks, the method comprising:

resetting an input and an output common mode voltage to a respective first and second voltage value;

sampling a noise signal component with at least one of a CDS feedback capacitor and a sensing feedback capacitor that is coupled in series with a sensing switch across an operational amplifier;

receiving an input signal comprising the noise signal component; and coupling the sense feedback capacitor between an input and an output of the operational amplifier via a switch to cancel the noise signal component, the operational amplifier receives in a reset phase an input common mode voltage and an output common mode voltage at its terminals.

9. The method according to claim 8, wherein resetting the input and an output common mode voltage further comprises applying the first and second voltage values to respective input and output terminals of both the CDS feedback capacitor and the sensing feedback capacitor.

10. The method according to claim 8, wherein sampling the noise signal component further comprises decoupling the CDS feedback capacitor from the input and output common mode voltages via a set of reset switches.

11. The method according to claim 10, further comprising activating a plurality of switches to perform the resetting, sampling, and canceling.

12. The method according to claim 10, wherein resetting occurs during a first operating interval and the sampling occurs during a second operating interval of a same operation cycle.

13. The method according to claim 10, further comprising decoupling the CDS feedback capacitor from the input and output common mode voltages and amplifying an analog differential input signal during a third operating interval.

14. The method according to claim 13, further comprising decoupling the sensing feedback capacitor from the output common mode voltage.

15. The method according to claim 8, wherein sampling the noise signal component further comprises maintaining a constant charge on the sensing feedback capacitor.

16. A system to cancel unwanted signals form a sensor, the system comprising:
a sensor; and
a switched-capacitor network coupled to the sensor, the switched-capacitor network comprises:
an operational amplifier comprising an input and an output;
a first reset switch coupled to the input to receive an input common mode voltage;
a second reset switch coupled to the output to receive an output common mode voltage;
a CDS capacitor coupled to the input common mode voltage and the output common mode voltage via first and second reset switch, the CDS capacitor decouples the input common mode voltage from the output common mode voltage;
a sensing capacitor coupled to the CDS capacitor to store a charge associated with an unwanted signal;
first and second CDS switches coupled to the sensing capacitor and the output common mode voltage; and
a sensing switch coupled in series with the sensing capacitor, the series combination coupled to the input common mode voltage and the output common mode voltage via the first and second reset switch.

17. The system according to claim 16, wherein the sensor is a fully differential capacitive sensor capable of delivering a signal equal to the difference between a positive sensor signal and a negative sensor signal.

18. The system according to claim 17, wherein the sensor is a multi-axis sensor comprising multiple sets of variable capacitors that are multiplexed by one or more controlled switches.

19. The system according to claim 16, further comprising an input common mode feedback control loop to control the input common mode of the operational amplifier.

* * * * *